(12) United States Patent
Brick et al.

(10) Patent No.: US 11,152,423 B2
(45) Date of Patent: Oct. 19, 2021

(54) OPTICAL ASSEMBLY AND DISPLAY DEVICE COMPRISING AN ARRANGEMENT OF LUMINESCENCE DIODE CHIPS

(71) Applicant: OSRAM Opto Semiconductors GmbH, Regensburg (DE)

(72) Inventors: Peter Brick, Regensburg (DE);
Matthias Sabathil, Regensburg (DE);
Frank Singer, Regenstauf (DE);
Thomas Schwarz, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/098,283

(22) PCT Filed: May 11, 2017

(86) PCT No.: PCT/EP2017/061345
§ 371 (c)(1),
(2) Date: Nov. 1, 2018

(87) PCT Pub. No.: WO2017/194682
PCT Pub. Date: Nov. 16, 2017

(65) Prior Publication Data
US 2019/0157339 A1    May 23, 2019

(30) Foreign Application Priority Data
May 12, 2016   (DE) .......................... 102016108776.9

(51) Int. Cl.
*H01L 27/15*   (2006.01)
*H01L 25/075*   (2006.01)
(Continued)

(52) U.S. Cl.
CPC ........ *H01L 27/156* (2013.01); *H01L 25/0753* (2013.01); *H01L 33/08* (2013.01); *H01L 33/58* (2013.01); *H01L 33/62* (2013.01)

(58) Field of Classification Search
CPC ....... H01L 27/156; H01L 33/08; H01L 33/62; H01L 33/58; H01L 25/0753
See application file for complete search history.

(56) References Cited

U.S. PATENT DOCUMENTS

| 8,399,893 B2 | 3/2013 | Eissler et al. |
| 9,772,087 B2 | 9/2017 | Marfeld et al. |

(Continued)

FOREIGN PATENT DOCUMENTS

| CN | 106097900 A | 11/2016 |
| DE | 102008047579 A1 | 4/2010 |

(Continued)

OTHER PUBLICATIONS

"MicroLED Displays: Hype and Reality, Hope and Challenges," Yole Report, 2017, downloaded from YDLS17003_MicroLED_Displays_Report_February_2017_Report.pdf on Feb. 26, 2019, 2 pages.

*Primary Examiner* — Thao X Le
*Assistant Examiner* — Gardner W. S. Swan
(74) *Attorney, Agent, or Firm* — Slater Matsil, LLP

(57) ABSTRACT

An optical assembly and a display device are disclosed. In an embodiment an optical assembly includes a common carrier, a plurality of first chip groups, each first chip group comprising at least two similar luminescence diode chips, a plurality of second chip groups, each second chip group comprising at least two similar luminescence diode chips, wherein the first and second chip groups are arranged planar along a regular grid of first unit cells on a main surface of the common carrier and an optical element arranged downstream of the first and second chip groups with respect to a (Continued)

main radiation direction, wherein the luminescence diode chips of the different chip groups are configured to emit electromagnetic radiation of different wavelength characteristics.

18 Claims, 12 Drawing Sheets

(51) Int. Cl.
*H01L 33/58* (2010.01)
*H01L 33/08* (2010.01)
*H01L 33/62* (2010.01)

(56) References Cited

U.S. PATENT DOCUMENTS

| | | |
|---|---|---|
| 10,181,501 B2 | 1/2019 | Chen |
| 2002/0096994 A1 | 7/2002 | Iwafuchi et al. |
| 2014/0036508 A1* | 2/2014 | Ou .................... F21V 7/00 |
| | | 362/267 |
| 2014/0084775 A1 | 3/2014 | Kobori |
| 2014/0153281 A1* | 6/2014 | Zhao ................ G02B 6/0055 |
| | | 362/607 |
| 2015/0357360 A1 | 12/2015 | Tian et al. |
| 2016/0027838 A1 | 1/2016 | Park et al. |
| 2016/0076731 A1 | 3/2016 | Monch et al. |
| 2017/0062674 A1* | 3/2017 | Kwon ............... H01L 25/0753 |
| 2018/0211940 A1* | 7/2018 | Henry .............. H01L 27/156 |
| 2018/0366593 A1* | 12/2018 | Huang ............. H01L 27/14643 |

FOREIGN PATENT DOCUMENTS

| | | |
|---|---|---|
| EP | 2544233 A1 | 1/2013 |
| JP | 2002217454 A | 8/2002 |
| WO | 2010091998 A1 | 8/2010 |
| WO | 2014173736 A1 | 10/2014 |
| WO | 2016016460 A1 | 2/2016 |
| WO | 2016016461 A1 | 2/2016 |

\* cited by examiner

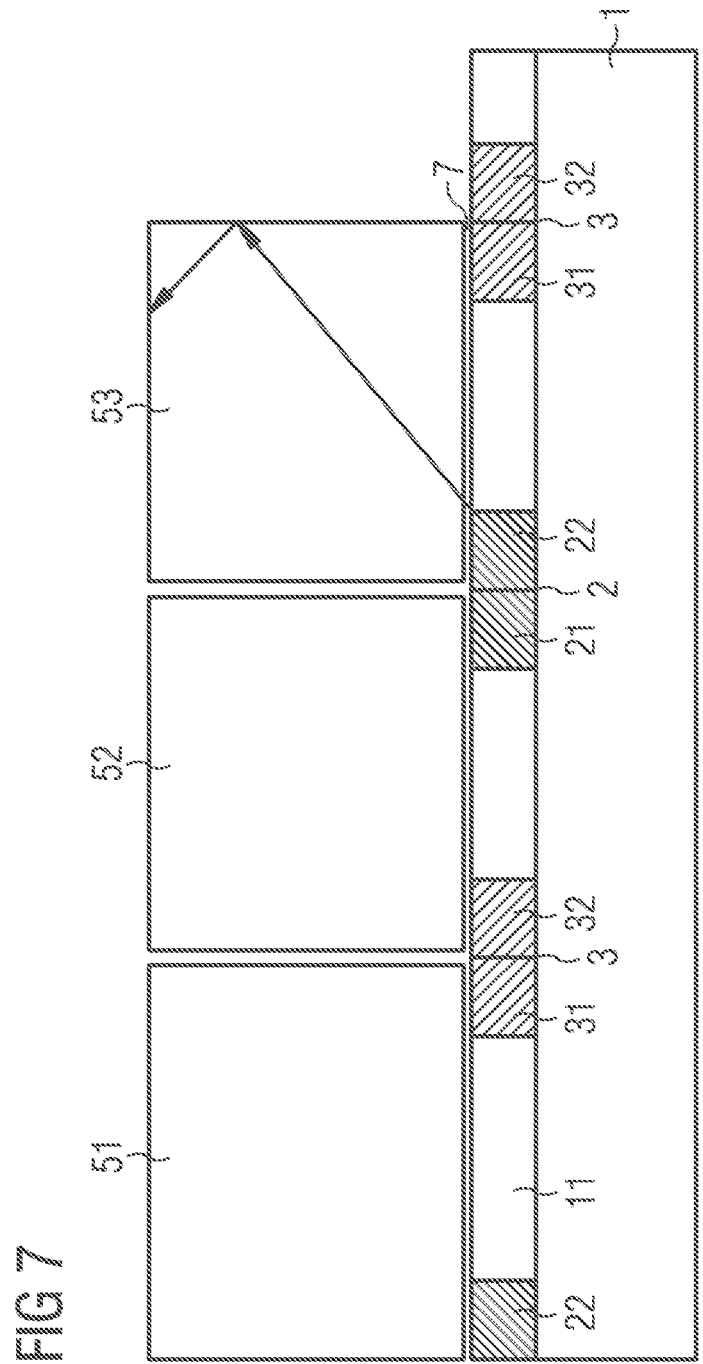

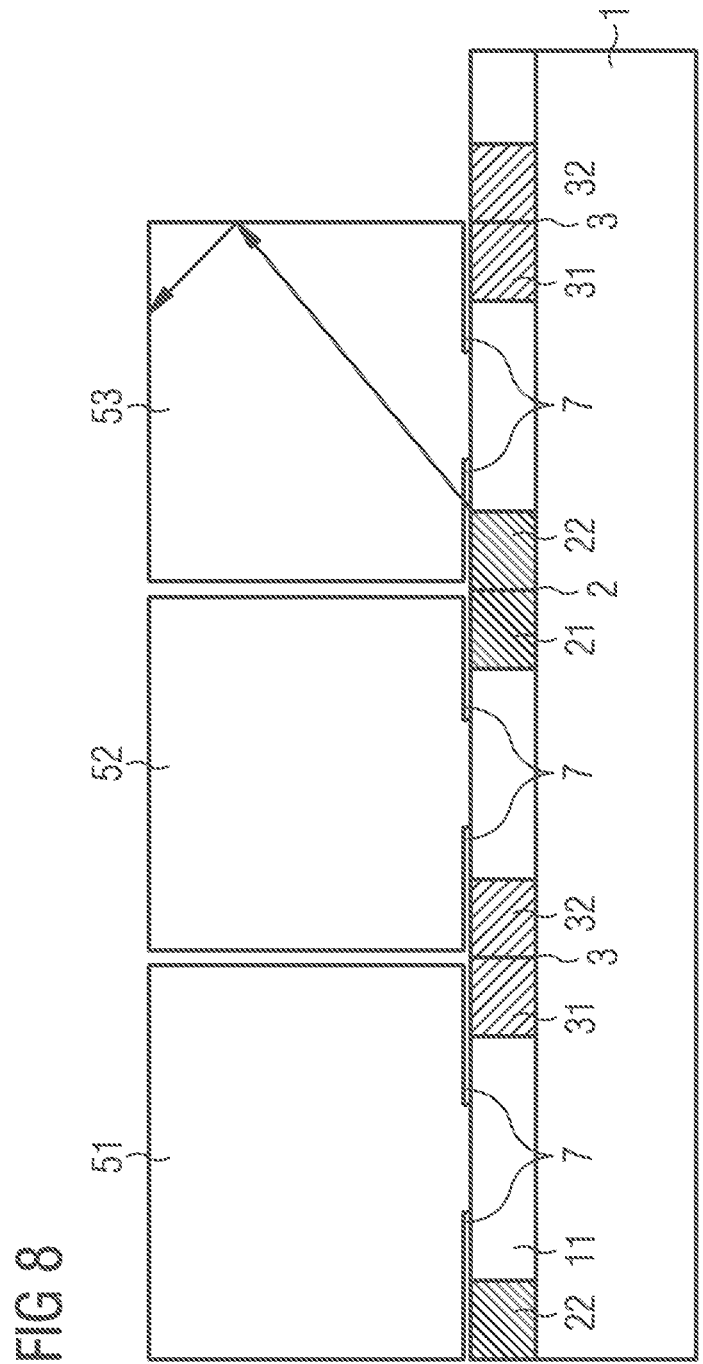

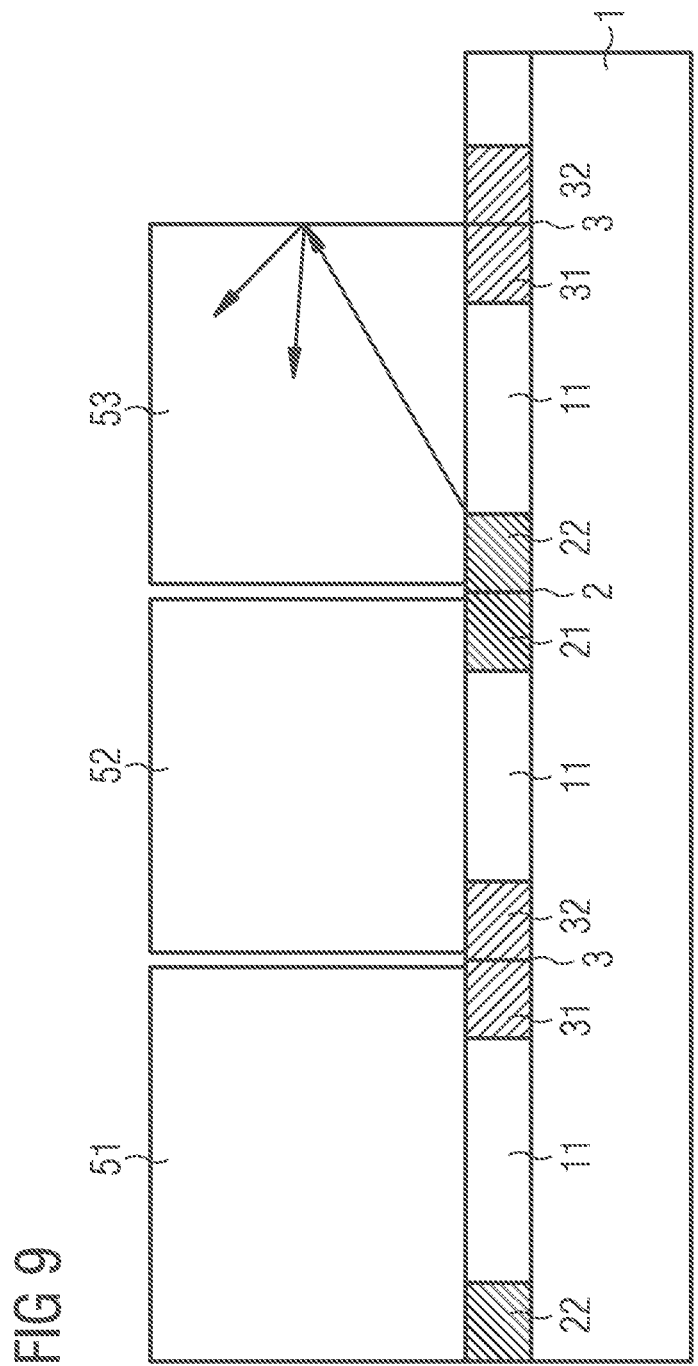

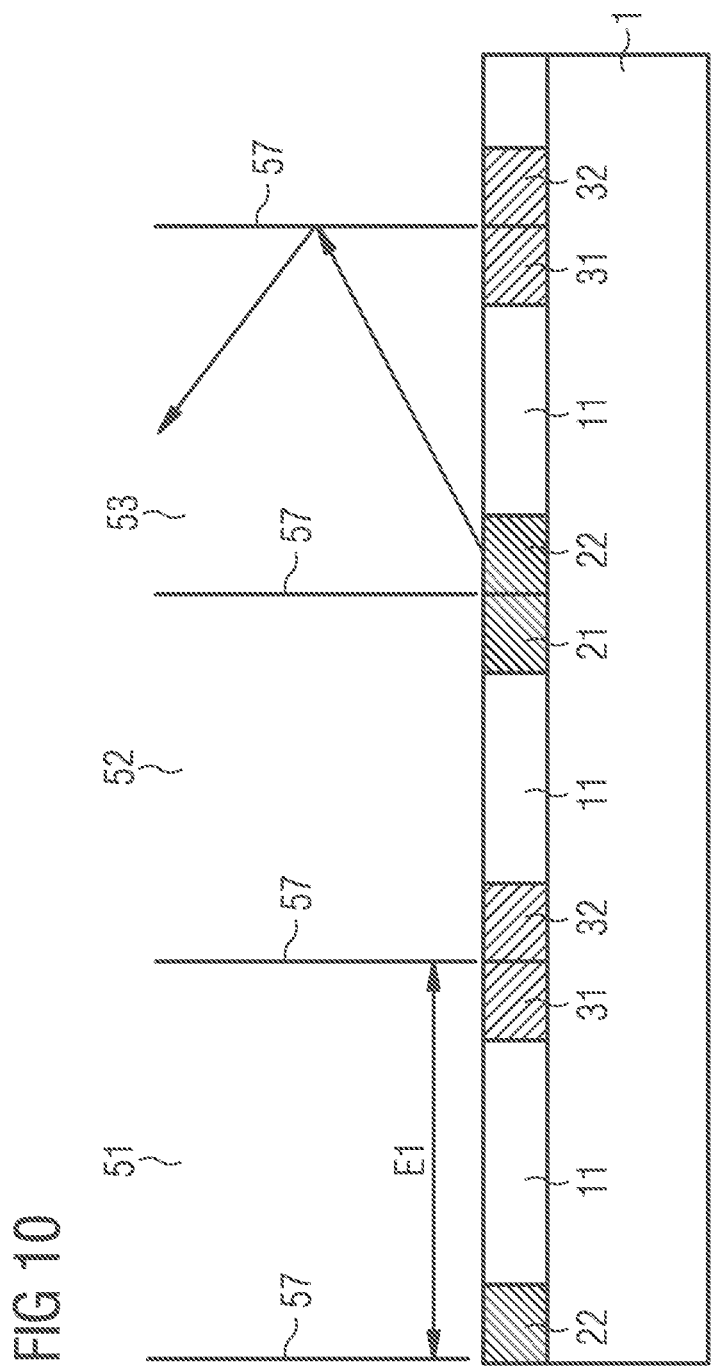

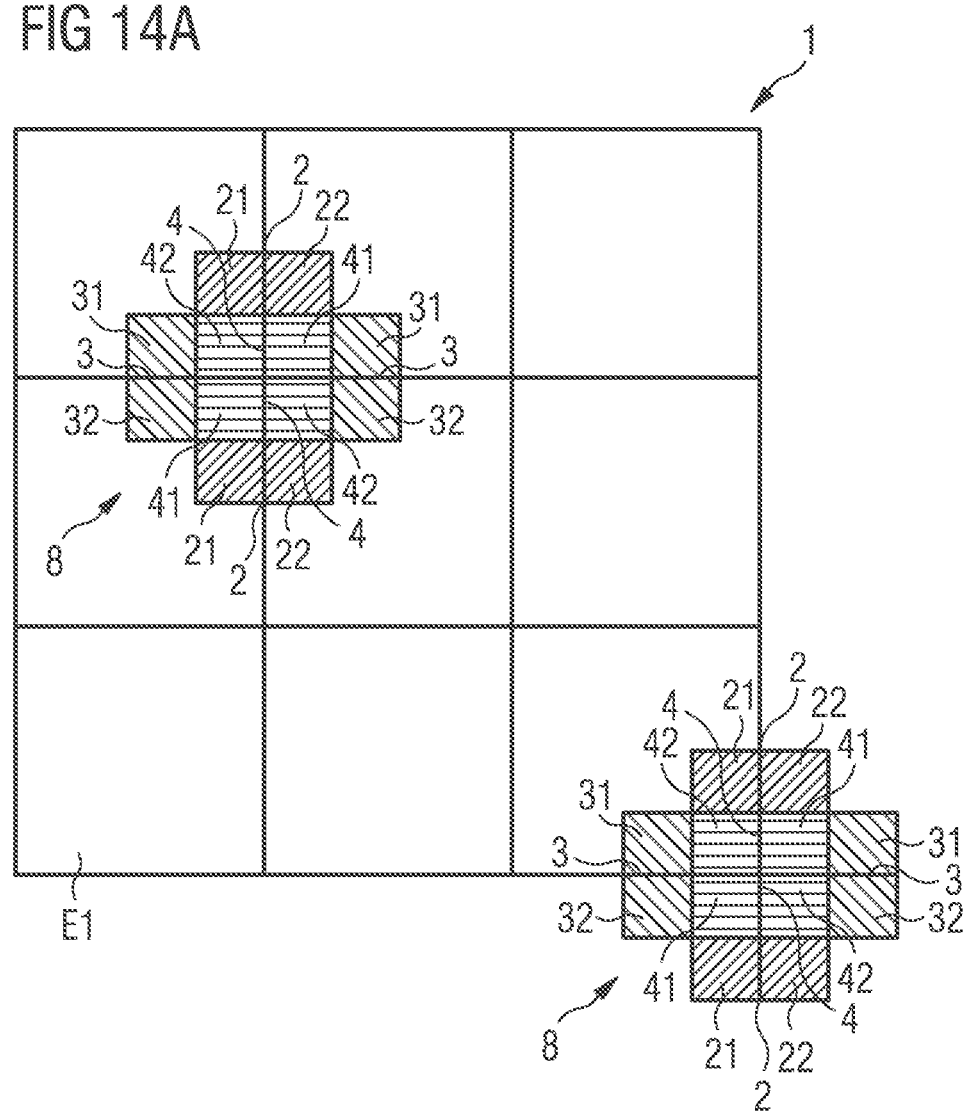
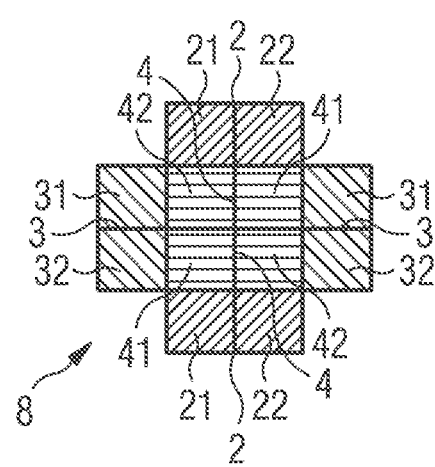

OPTICAL ASSEMBLY AND DISPLAY DEVICE COMPRISING AN ARRANGEMENT OF LUMINESCENCE DIODE CHIPS

This patent application is a national phase filing under section 371 of PCT/EP2017/061345, filed May 11, 2017, which claims the priority of German patent application 10 2016 108 776.9, filed May 12, 2016, each of which is incorporated herein by reference in its entirety.

TECHNICAL FIELD

This invention relates to an optical assembly.

SUMMARY OF THE INVENTION

Modern display devices are often based on an arrangement of a large number of light emitting diode chips, which are combined in a multichip component for use as a display, such as a narrow pixel pitch video wall module. Here, for example, the idea is being pursued of replacing individual red, green, blue (RGB) LED chips with chip groups each with a large number of light emitting diode chips of the same color. This will make it possible to avoid the restrictions caused by the chips being placed on the chip carrier and achieve a higher density and thus a higher resolution.

Previous optical assemblies for display devices, for example, used prisms or microlens arrays, which can lead to undesirable distortions in the image display. The beam guidance is often complex and limited by the dense grouping of the light emitting diode chips on a common carrier.

Embodiments provide an optical assembly and a display device that enables high resolution and better image quality.

In at least one embodiment, an optical assembly comprises a large number of first chip groups and a large number of second chip groups. Each of the two chip groups comprises at least two similar luminescence diode chips.

The luminescence diode chips from one chip group are designed to emit electromagnetic radiation of the same wavelength characteristic. The luminescence diode chips from different chip groups, on the other hand, are designed to emit electromagnetic radiation of different wavelength characteristics. Subunits of the optical element are arranged in openings of a mask. This advantageously increases the optical separation of adjacent unit cells and thus increases the contrast. Furthermore, the mask can also be made of a light-absorbing material, which advantageously reduces disturbing reflections on the surface for the observer. The luminescence diode chips within one of the chip groups are arranged side by side with respect to a main radiation direction. This means that the luminescence diode chips can be arranged side by side within one of the chip groups in a lateral direction which runs transversely or perpendicular to the main radiation direction.

The similar luminescence diode chips, for example, are of the same manufacturing type and differ only in process-related manufacturing tolerances. This means that within a chip group the luminescence diode chips have essentially the same peak or dominant wavelength, respectively emit in the same spectral region. Production-related deviations, such as different radiation intensities, can occur. For example, luminescence diode chips are inorganic, monocrystalline LEDs (light emitting diodes) or organic light-emitting diodes, which are built in thin-film technology on a common substrate as integrated matrices (so-called OLEDs or organic light emitting diodes). A chip group can also be designed as an OLED with two or more segments that can be controlled individually. In particular, luminescence diode chips can also be laser diodes, in particular vertical-cavity surface-emitting laser diodes (VCSEL).

The chip groups are arranged along a regular grid of first unit cells on a main surface of a common carrier. Each of the first unit cells comprises at least one luminescence diode chip from one of the first chip groups and one luminescence diode chip from one of the second chip groups assigned to the unit cell.

An optical element is provided and arranged downstream of the chip groups with respect to the main radiation direction. The optical element is designed to combine light emitted by the luminescence diode chips of the chip groups in second unit cells in an extraction plane: At least one second unit cell has an area that is less than or equal to the area of one of the first unit cells.

The term "unit cell" refers to the arrangement of the luminescence diode chips or chip groups. Within the first unit cells several chip groups are arranged proportionally with at least one luminescence diode chip, whereby preferably the number and/or arrangement of the respective luminescence diode chips is the same in the first unit cells. By assigning different luminescence diode chips to first unit cells, image elements can be constructed which emit in different colors. For example, a unit cell can have two luminescence diode chips of different colors. For display devices and displays, however, further luminescence diode chips with any wavelength characteristics, for example, in the three basic colors red, green, blue (RGB), can also be assigned to unit cells. The luminescence diode chips of a first unit cell correspond to an image element or pixel in the extraction plane.

Furthermore, the term "planar arrangement on the carrier" is to be understood in such a way that the luminescence diode chips can be arranged next to each other, for example, in a row, as well as in the manner of a matrix, e.g., a 2×2 matrix, in a chip group. The chip groups can also be arranged along the grid in rows and matrices.

The term "regular lattice" describes a lattice arrangement in which a unit cell can describe the entire lattice. In connection with the carrier, the grid is also two-dimensional. In particular, the regular two-dimensional lattice can be periodic or quasi-periodic. The lattice results, for example, from periodic or quasi-periodic repetition of the arrangement of chip groups defined in the first unit cells on the carrier. Preferably the repetition is defined by translation in two different directions in the surface of the carrier. As a result of the design of the optical element, there is also a repeating grid in the extraction plane on the basis of the second unit cells.

The unit cells can, for example, be triangular, rectangular, square, pentagonal, hexagonal, etcetera. Thus it is possible to arrange the chip groups according to the two-dimensional lattice in the form of triangles, rectangles, quadrangles, pentagons, hexagons, etcetera or in quasicrystalline lattices. If, for example, the target application is a curved, two-dimensional direct display, corresponding curved chip arrays can be considered, such as a two-dimensional penta- and hexagonal-type grid suitable for building a spherical football.

The common carrier preferably comprises a printed circuit board, a substrate and/or a ceramic. For example, the carrier has electrical connections to connect the optical assembly with a control unit. The individual luminescence diode chips are preferably interconnected on the carrier in such a way that they can be controlled individually or in groups by the control unit. In particular, the intensity of the light emitted by a controlled luminescence diode chip can be adjusted by the control unit.

The second unit cells are defined in the extraction plane. They comprise the light of the luminescence diode chips from the different chip groups guided by the optical element. In particular, a second unit cell is the smallest unit of luminescence diode chips in the extraction plane that can be used to describe the light redistribution in the extraction plane.

A simplified manufacturing process is possible by using chip groups of similar luminescence diode chips. For example, it is an advantage to group only similar luminescence diode chips because there is no need for a filter arrangement with different color filters, such as a Bayer matrix, or converters assigned to individual pixels. This not only makes the manufacturing process simpler, but also more cost-effective.

By using the optical element, a high resolution of the entire optical assembly is achieved, since light from luminescence diode chips of different groups is combined in the second unit cells, although these do not have to be directly adjacent to each other in the first unit cells. In particular, the resolution is not determined by the size of the luminescence diode chips, for example, by their edge length. The light emitted by the luminescence diode chips is redistributed by the optical element. The redistribution results in light of different wavelengths being combined in the second unit cells and these unit cells being smaller in area than the first unit cells, which are essentially formed by the chip groups. The optical assembly redistributes the light emitted by the luminescence diode chips in such a way that the resulting second unit cells are smaller than the first unit cells. This results in advantages for the design of directly emitting RGB displays.

According to at least one embodiment, the optical assembly comprises a structure in which a distance between luminescence diode chips within a chip group is smaller than a distance between luminescence diode chips of neighboring chip groups. This means that in the lateral direction the luminescence diode chips within a chip group are closer to each other than the luminescence diode chips of different chip groups are to each other.

According to at least one embodiment, the optical assembly comprises at least one plurality of a further chip group of luminescence diode chips. The luminescence diode chips of the further chip groups are designed to emit electromagnetic radiation with different wavelength characteristics from the first and second chip groups. For example, the first chip groups comprise red emitting luminescence diode chips, the second chip groups green emitting luminescence diode chips and the further chip groups blue emitting luminescence diode chips. The first unit cells then form a matrix such as an RGB or Bayer matrix.

However, the term "further chip groups" can also mean that third, fourth, etc. chip groups are formed. Chip groups with in each case similar luminescence diode chips can be provided. Any colors can be assigned to the respective chip groups by combining corresponding luminescence diode chips in these groups. Also, the number of chip groups is not limited to three, but basically any number of different chip groups can be provided.

Each of the first unit cells is assigned at least one luminescence diode chip from one of the first, second and further chip groups. The optical element is designed to combine light emitted by the luminescence diode chips of the first, second and further chip groups into second unit cells in such a way that at least one second unit cell has an area which is less than or equal to the area of one of the first unit cells.

According to at least one embodiment, the chip groups each comprise two luminescence diode chips or each comprise four luminescence diode chips.

According to at least one embodiment, the chip groups are arranged either between corners of the first unit cells, whereby the corners of the first unit cells themselves are free of luminescence diode chips. Alternatively, the chip groups are arranged at the corners of the first unit cells. Then regions between the corners do not comprise luminescence diode chips. In both cases the chip groups are arranged on the carrier in first unit cells in such a way that similar luminescence diode chips are directly or immediately adjacent, while a larger distance can remain between the individual chip groups.

According to at least one embodiment, the luminescence diode chips of a chip group are directly adjacent to each other.

According to at least one embodiment, the luminescence diode chips of a chip group are monolithically formed with each other.

According to at least one embodiment, the optical element is arranged and arranged downstream of the chip groups in such a way that light emitted by the luminescence diode chips, which are jointly assigned to one of the first unit cells, is combined by means of the optical element in a second unit cell in the extraction plane. In other words, the optical element does not cause overlaps between different unit cells, but the light emitted from one unit cell is also only combined into one second unit cell in the extraction plane.

According to at least one embodiment, the optical element comprises a plurality of subunits. These subunits are each assigned to one of the first unit cells and are arranged downstream of the chip groups in such a way that the subunits cover at least a part of the assigned first unit cells along the main radiation direction.

According to at least one embodiment the subunits of the optical element are arranged in openings of a mask.

According to at least one embodiment, the mask is applied to the optical element by printing, gluing, laminating, casting and/or molding.

According to at least one embodiment, a reflective material, an absorbent material and/or a light-scattering material are applied to surfaces of the mask and/or surfaces of the optical element.

According to at least one embodiment, the subunits in the region of the openings in the mask are trapezoidal.

According to at least one embodiment, the subunits each have an optical light guide arranged to combine the light emitted by the luminescence diode chips of the chip groups by total reflection on internal surfaces of the subunits in the second unit cells.

According to at least one embodiment, the subunits each have at least one mirrored surface, in particular a mirror. These are designed to combine the light emitted by the luminescence diode chips of the chip groups by reflection in the second unit cells.

According to at least one embodiment, the optical assembly has a transparent auxiliary carrier between the optical element and the luminescence diode chips. In particular, the auxiliary carrier is transparent for the electromagnetic radiation generated in the luminescence diode chips. The auxiliary carrier can be used to group the individual chip groups into RGB chip groups in advance, thus facilitating later positioning.

Furthermore, a method for producing an optical assembly is given. In particular, the method can be used to produce an optical assembly described here. This means that all features disclosed for the optical assembly are also disclosed for the method and vice versa.

In accordance with at least one embodiment of the method for producing an optical assembly, individual chip groups are first combined to form a module and arranged on an auxiliary carrier provided. This can be done, for example, by gluing. Subsequently, a large number of the modules are then arranged and fastened on a carrier. The chip groups face the carrier so that they are located between the carrier and the auxiliary carrier. The auxiliary carrier can completely cover several chip groups. In a next step, the optical element can be applied to the transparent auxiliary carrier. This is the case if the auxiliary carrier is transparent. The transparent auxiliary carrier can, for example, be formed with a plastic material or with a glass.

According to at least one embodiment of the method for producing an optical assembly, the auxiliary carrier is detached again after the chip groups have been attached to the carrier and the optical element can then be applied directly to the chip groups. This procedure has the advantage that an opaque or radiation-impermeable auxiliary carrier can also be used.

Furthermore, a display device with an optical assembly described here is specified. This means that all features disclosed for the optical assembly are also disclosed for the display device and vice versa.

According to one embodiment, a display device comprises an optical assembly as shown above. In addition, the display device has a control unit for driving the luminescence diode chips arranged on the carrier.

On a carrier of a suitable size, the large number of chip groups with luminescence diode chips can be arranged. The first unit cells represent the smallest unit. In this way, the optical assembly can be assembled and operated to form a display device such as a screen, television or monitor. At a given resolution, e.g., for an HDTV display (High Definition Television), a display device of the proposed type, which has pixelated chips and the optical element described, requires significantly fewer chips than a comparable display device consisting of small individual chips.

BRIEF DESCRIPTION OF THE DRAWINGS

The invention is explained in more detail below using figures. As far as parts or components correspond in their function, their description is not repeated in each of the following figures.

The figures and the proportions of the elements among each other depicted in the figures are not to be regarded as true to scale. Rather, individual elements and in particular layer thicknesses may be exaggeratedly large for better representability and/or better understanding.

In the drawings:

FIG. 1 shows an exemplary embodiment of an optical assembly in a top view;

FIG. 2 shows a further exemplary embodiment of an optical assembly in a top view;

FIGS. 3 to 10 show further exemplary embodiments of an optical assembly in a side view with an optical element;

FIGS. 11A and 11B show top views of another exemplary embodiment of an optical assembly, as well as a module from it;

FIG. 12 shows a lateral sectional view of the optical assembly from FIG. 11A;

FIG. 13 shows another lateral sectional view of an optical assembly; and

FIGS. 14A and 14B show top views of a further exemplary embodiment of an optical assembly, as well as a module from it.

DETAILED DESCRIPTION OF ILLUSTRATIVE EMBODIMENTS

Figure 1:
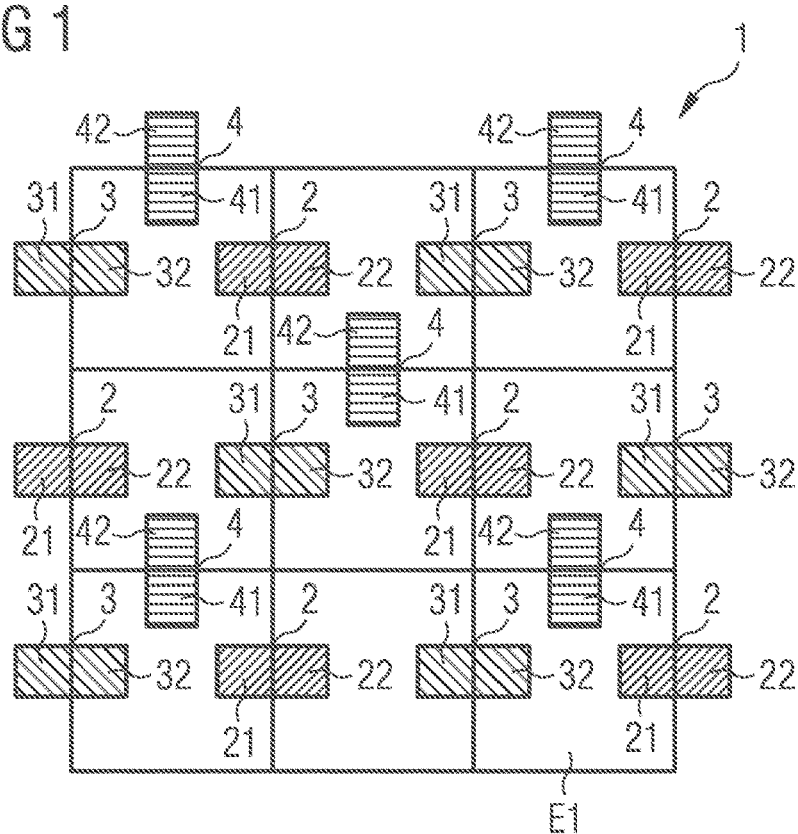

FIG. 1 shows an exemplary embodiment of an optical assembly. On a common carrier 1 several luminescence diode chips 21, 22, 31, 32, 41, 42 are each arranged planar in chip groups 2, 3, 4. Each of the chip groups comprises two similar luminescence diode chips 21 and 22, 31 and 32, or 41 and 42. Similar luminescence diode chips are each designed to emit substantially the same colors. For example, first chip groups 2 each comprise red emitting luminescence diode chips 21, 22. Second chip groups 3 each include green emitting luminescence diode chips 31, 32, and third chip groups 4 each include blue emitting luminescence diode chips 41, 42.

The chip groups, and thus the luminescence diode chips, are arranged along a grid in unit cells E1 on the carrier 1. Parallel to the grid there is an input plane EE in which the first unit cells come to rest. In each unit cell E1 there are different luminescence diode chips each from three different chip groups. For example, a single unit cell E1 comprises a red, green and blue emitting luminescence diode chip. In this way, a light emitting diode matrix can be formed on the carrier 1. For example, this is an RGB color matrix, like a Bayer matrix. In this sense, other color matrices can also be formed on the basis of other colors. The remaining luminescence diode chips from the chip groups are assigned to further unit cells. With the exception of the edge of the optical assembly, all luminescence diode chips are thus assigned to at least one unit cell. Again except for the edge, all luminescence diode chips from the chip groups are also assigned to a further unit cell, so that a chip group (except for those at the edge of the arrangement) has two luminescence diode chips each, which are assigned to different unit cells.

When chip groups or luminescence diode chips are arranged in unit cells E1 of the grid (at the input plane EE), distances between the luminescence diode chips within one of the chip groups are always smaller than distances between adjacent chip groups. In the present embodiment, the chip groups are arranged between corners of the individual unit cells.

The carrier 1 and the luminescence diode chips can be a monolithic component. Alternatively, carrier 1 can be manufactured separately and then fitted with the individual chips. Not shown in the drawing are electrical wiring, as well as details of the structure and the corresponding components, such as adhesive, solder, solder pads, bonding wires and the like. The luminescence diode chips are electronically contactable and controllable. The luminescence diode chips typically have a diameter in the range of 50 µm and are arranged side by side, so that one chip group is approximately 100 µm long. The first unit cells have an edge length in the order of 1000 µm.

Figure 2:
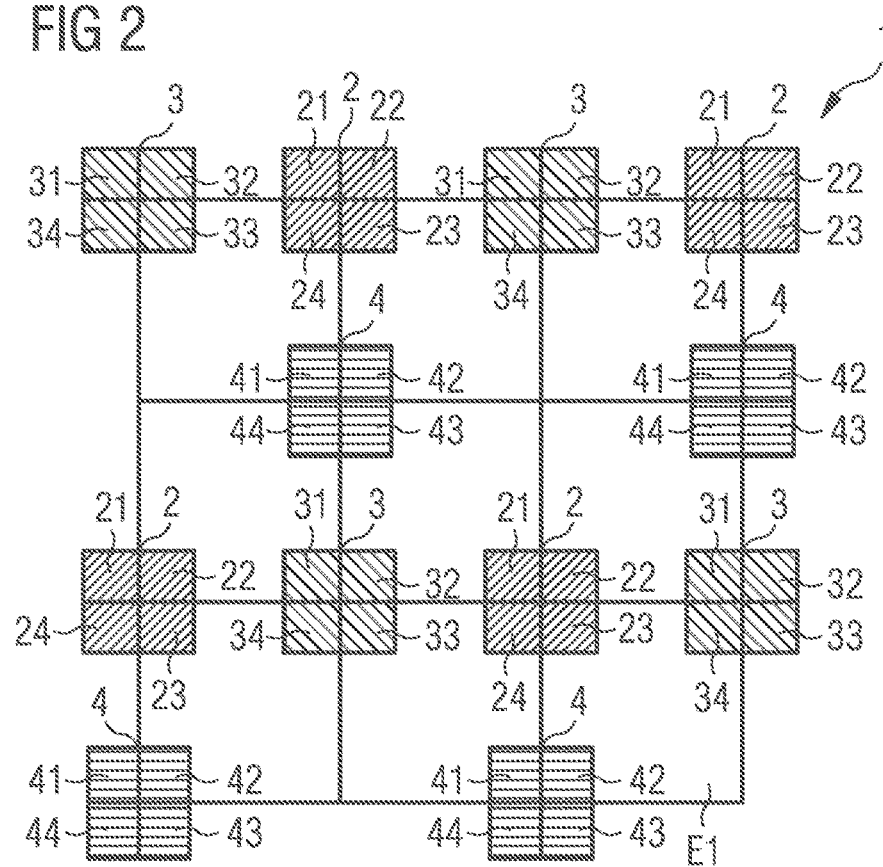

FIG. 2 shows another exemplary embodiment of an optical assembly. This design is similar to the one in FIG. 1. Each of the chip groups now comprises four similar luminescence diode chips 21, 22, 23 and 24, as well as 31, 32, 33 and 34, and 41, 42, 43 and 44, respectively. Similar luminescence diode chips are again designed to emit essentially similar colors. For example, first chip groups 2 each comprise red emitting luminescence diode chips 21, 22, 23, 24. Second chip groups 3 each comprise green emitting luminescence diode chips 31, 32, 33, 34 and third chip groups 4 each comprise blue emitting luminescence diode chips 41, 42, 43, 44.

The chip groups and thus the luminescence diode chips are arranged planar along the grid in the first unit cells E1 on the carrier 1. In each of the unit cells E1 there is a luminescence diode chip from three different chip groups 2, 3, 4. For example, a unit cell E1 comprises a red, green and blue emitting luminescence diode chip. The remaining three luminescence diode chips from the respective chip groups are assigned to further unit cells. With the exception of the edge of the optical assembly, all luminescence diode chips are assigned to at least one unit cell. Again up to the edge, all luminescence diode chips from the chip groups are assigned to further unit cells.

As with the arrangement of chip groups or luminescence diode chips in unit cells of a grid according to FIG. 1, distances between the luminescence diode chips within one of the chip groups are always smaller than distances between adjacent chip groups. In the present embodiment, the chip groups are arranged at the corners of the grid or the individual unit cells E1.

Figure 3:
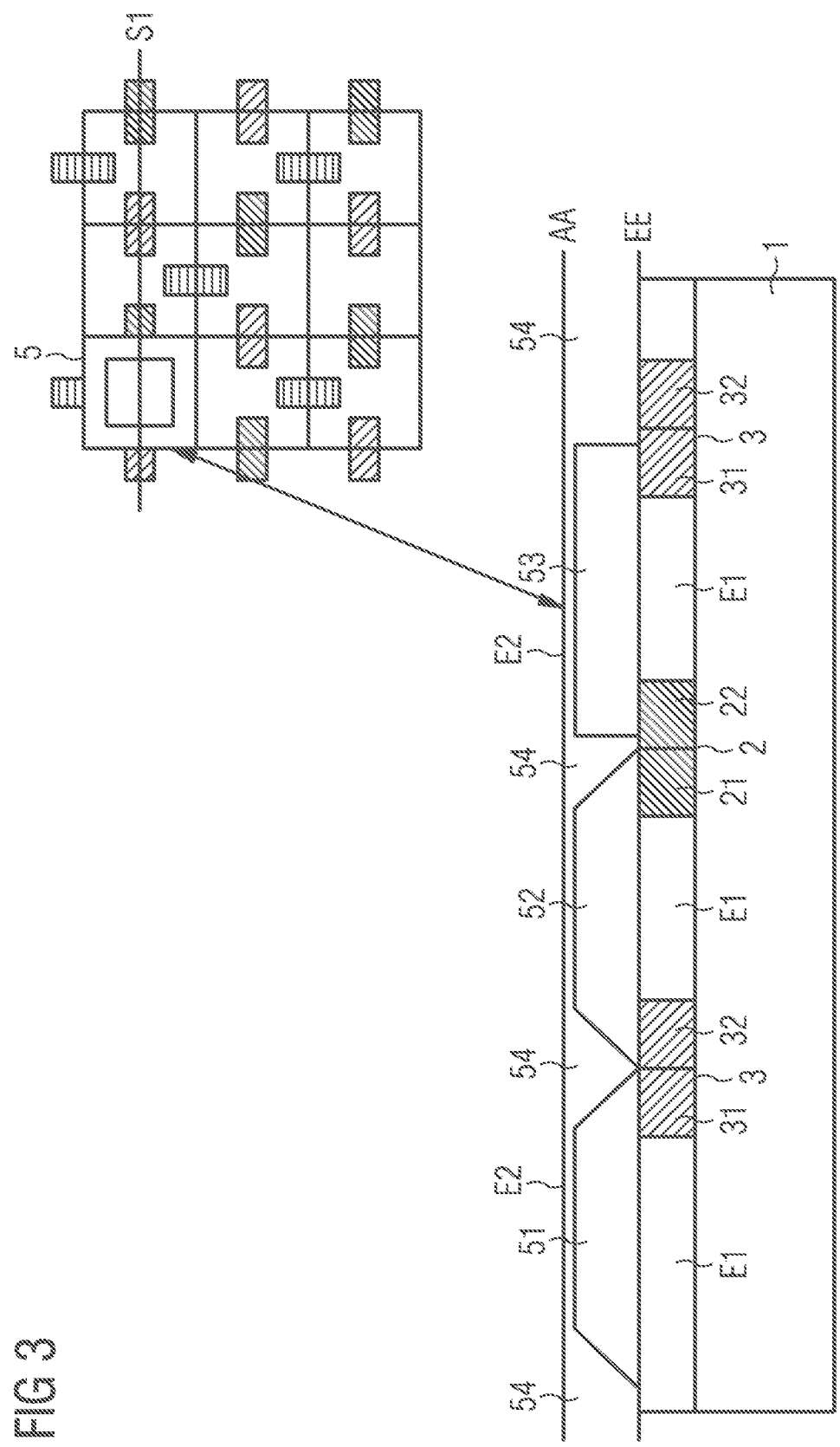

FIG. 3 shows an exemplary embodiment of an optical assembly in a side view with an optical element. In the drawing above right a top view of the optical assembly is indicated. The lower part shows a sectional drawing along a cutting line S1 of an embodiment according to FIG. 1. However, the following explanations can also be transferred analogously to an embodiment according to FIG. 2.

The carrier 1 is shown on which luminescence diode chips of three chip groups are arranged. An optical element 5 is arranged downstream, i.e., above the chip groups, along a main direction of radiation facing away from the carrier 1. This optical element 5 comprises subunits 51, 52 and 53, which are separated from each other by regions 54. For example, the subunits 51, 52 are trapezoidal. The Subunits 53 can also have other geometries and, for example, be cuboid. All subunits or the optical element are (at least partially) transparent to the electromagnetic radiation emitted by the luminescence diode chips.

The optical element 5 or its subunits can be designed in different ways, as explained in connection with the following figures. A common feature of all these embodiments is that the light emitted by the luminescence diode chips along the main radiation direction is coupled into the downstream optical element 5. Subsequently, the emitted light is deflected within the optical element and coupled out in an extraction plane AA. The optical element or its subunits are designed to mix the emitted light at least partially, so that the light emitted by the luminescence diode chips is superimposed or mixed to a mixed color in the extraction plane AA. In this way, mixed colors are imaged in the extraction plane AA.

The respective subunits of the optical element are arranged in such a way that they essentially each cover a complete first unit cell E1 (see figure above right) when looking at the optical element 5 along the main radiation direction. In other words, the subunits define second unit cells E2 in the extraction plane AA, which are delimited, for example, by the subunits. In these second unit cells E2, the optical element 5 mixes the light emitted by the luminescence diode chips, which are assigned to a first unit cell E1. Depending on the control input, for example, by a set intensity value, different colors can be mixed and used as image elements of a display device or display, for example.

A second unit cell E2 has a smaller or equal area in the extraction plane AA than an area of a first unit cell E1 in the input plane EE. In particular, this has the advantage that the luminescence diode chips themselves can be larger and can be mounted with less mounting effort. Nevertheless, a high optical resolution can be achieved with the help of the optical element 5.

Figure 4:
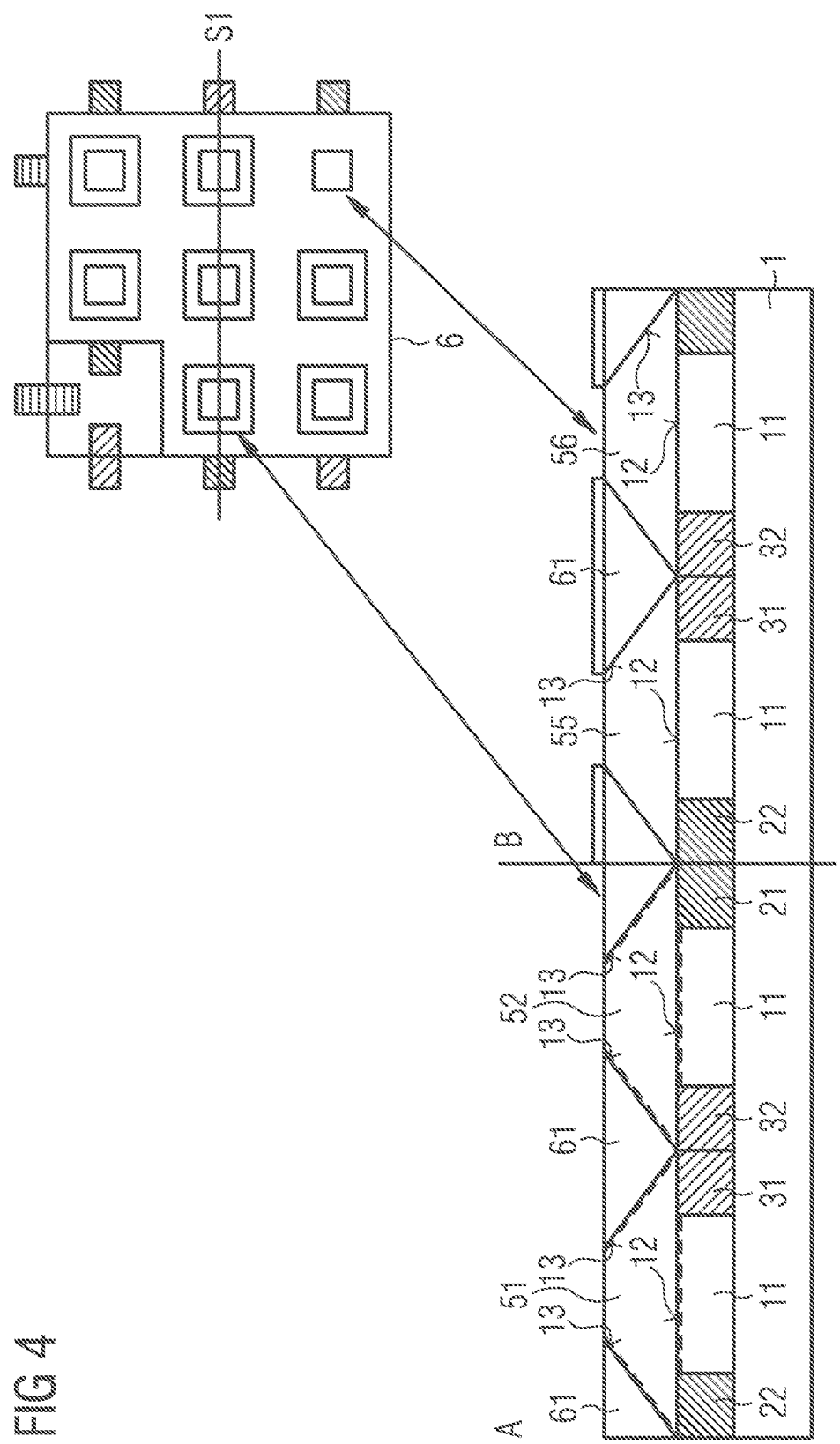

FIG. 4 shows a further exemplary embodiment of an optical assembly in a side view with an optical element. In the drawing above right a top view of the optical assembly is indicated. The lower part of the drawing shows a side view along the cutting line S1. The exemplary embodiment shown here is also shown in two alternative forms A and B. In both examples a mask 6 is shown on the optical element 5. The input or extraction plane as well as the corresponding unit cells are not shown for a better representation, but are analogous to FIG. 3.

In example A, interspaces 11 between luminescence diode chips 21, 22, 31, 32 are filled with a material such as a mold material. This material, for example, is opaque, e.g., black, and not transparent to the light emitted by the luminescence diode chips. However, the material can also be transparent and additionally mixed with light scattering particles. Optionally, a reflective or specular material can be found on a surface 12.

The subunits 51, 52 of the optical element 5 are arranged on a common surface formed by the chip groups 2, 3, 4 and the filled interspaces 11. In this exemplary embodiment the subunits 51, 52 are trapezoidal in shape, but can also have other shapes and be triangular, rectangular, etcetera. The subunits 51, 52 comprise a material, e.g., particles, that scatters light, so that the subunits correspond to a diffuser. Optionally, outer surfaces 13 are covered with a reflective or specular material.

Interspaces 61 between the subunits 51, 52 are also filled with a material, such as a mold material. For example, this material is opaque, e.g., black, and not transparent to the light emitted by the luminescence diode chips. The fillings between the subunits form a mask 6, whereby the subunits form 51, 52 openings through which the luminescence diode chips can emit light.

Example B is similar to example A and represents an alternative design to a certain extent. In contrast to example A, the interspaces 11 and the mask 6 are made of a bright or white mold material. At least the interspaces 61 of the mask 6 are made of an absorbent material. Optionally, the filled interspaces 11 can also be made of the absorbent material. The mask 6 can be applied by printing, gluing, laminating, using a casting process. The mask 6 can basically be applied to the optical assembly in one process or produced in a separate process and then applied.

The mask 6 of examples A and B gives a good black impression and thus increases the optical contrast of the optical assembly. The light-scattering particles have the effect that they ensure a good mixing of light through the optical element 5 or its subunits 51, 52, 55, 56. Surfaces such as the outer surfaces with a reflective or reflecting material but also bright or white mold material ensure a high degree of mixing efficiency.

Figure 5:
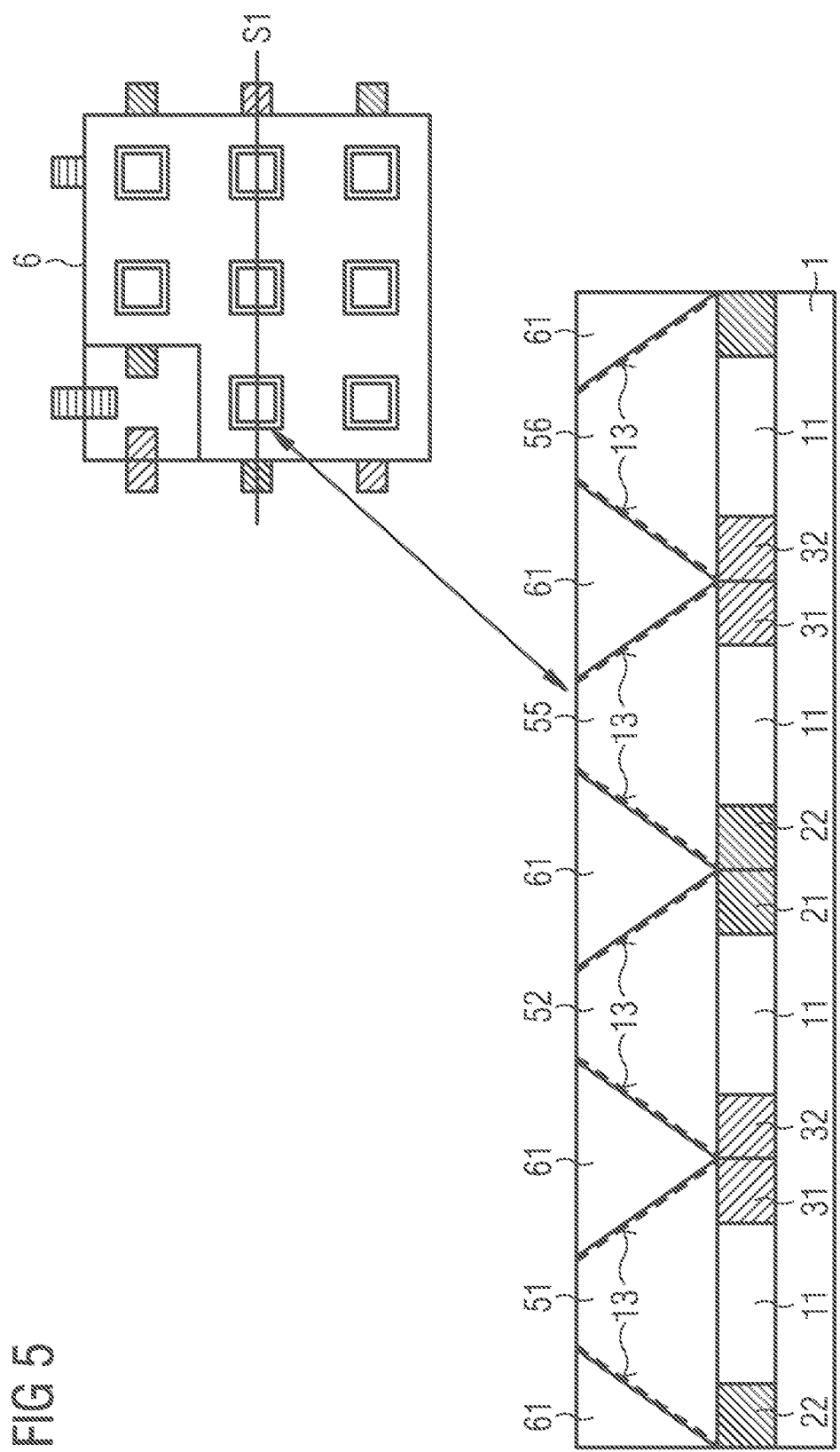

FIG. 5 shows another exemplary embodiment of an optical assembly in a side view with an optical element. In the drawing, a top view of the optical assembly is indicated at the top right. The lower part of the drawing shows a side view along the cutting line S1.

The exemplary embodiment is similar to the example A from FIG. 4 and can be transferred analogously to example B. On the one hand, a thickness of the optical element 5 or the mask 6 is increased. This layer thickness can be used, for example, controlling a black impression and thus to influence the contrast. A high layer thickness results in a high contrast, but can also lead to a lower efficiency if less light can be extracted.

Furthermore, a surface of the optical assembly formed by a surface of mask 6 and the optical element 5 can be at least partially roughened. Such structuring can be achieved, for example, by applying light scattering material to the surface. Examples are particles, hemispheres, grooves, prisms and similar structures. Such structures reduce reflections of ambient light on the surface and thus also improve the black impression and contrast of the optical assembly.

Figure 6:
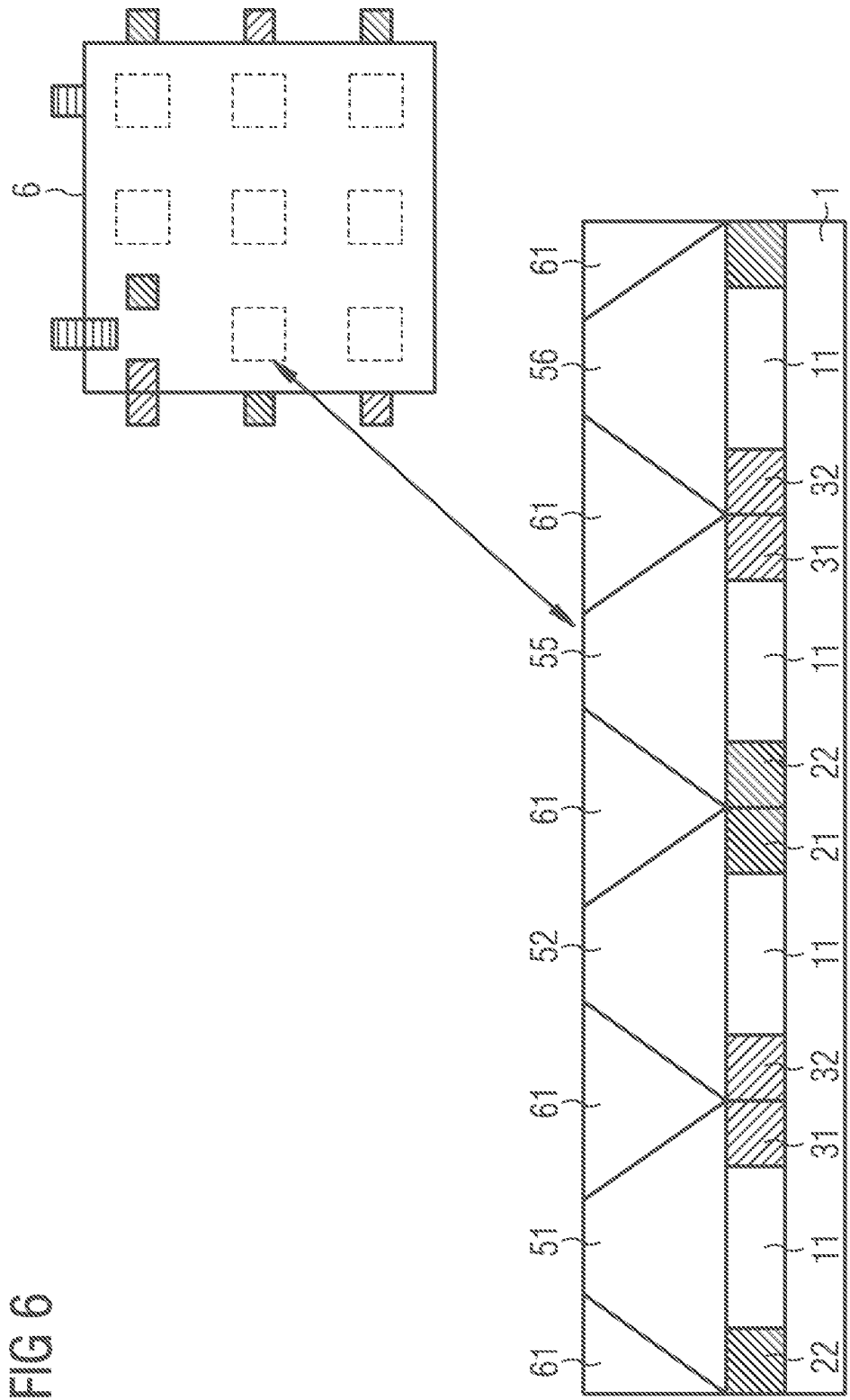

FIG. 6 shows a further exemplary embodiment of an optical assembly in a side view with an optical element. In the drawing above right a top view of the optical assembly is indicated. The lower part of the drawing shows a side view along the cutting line S1. The exemplary embodiment corresponds to example A of FIG. 4, wherein all mold materials are black or selected such that they absorb a large part of the incident ambient light. In this example, no further measures such as reflective or scattering material are provided. The illustration at the top right illustrates the different contrast impressions in comparison with FIGS. 4 to 6. In this exemplary embodiment, comparatively much ambient light is absorbed.

FIG. 7 shows a further exemplary embodiment of an optical assembly in a side view with an optical element.

Again shown is carrier 1 on which luminescence diode chips from the chip groups are arranged. The optical element 5 is arranged downstream, i.e., above the chip groups, along a main direction of radiation facing away from the carrier 1. A spacer 7 is provided for this. The optical element 5 comprises cuboid subunits 51, 52 and 53, which are separated from each other by regions 54. The subunits 53 can also have other geometries and be trapezoidal, for example. All subunits or the optical element are (at least partially) transparent for the electromagnetic radiation emitted by the luminescence diode chips.

The subunits 51, 52, 53 are arranged above the first unit cells E1. They preferably have an edge length that is 2.5 times the edge length of the luminescence diode chips. The subunits comprise a transparent material such as PC, PMMA, silicone, epoxy or glass and are spaced from each other.

The light emitted by the luminescence diode chips is coupled into the associated subunits 51, 52, 53. Within the subunits, the light is deflected by total reflection on the walls of the subunits and extracted in the extraction plane AA. In addition or alternatively, the walls can also have reflective or specular material. The subunits thus have the function of a light guide.

FIG. 8 shows a further exemplary embodiment of an optical assembly in a side view with an optical element. The only difference between this exemplary embodiment and the one in FIG. 7 is that the spacer 7 only extends over parts of the undersides of the subunits.

FIG. 9 shows a further exemplary embodiment of an optical assembly in a side view with an optical element. This example differs from those of FIGS. 7 and 8 only in that no spacer is provided on the undersides of the subunits 51, 52, 53 and the subunits rest directly on the chip groups.

FIG. 10 shows a further exemplary embodiment of an optical assembly in a side view with an optical element. In contrast to FIGS. 7 to 9, the subunits are formed by vertical (or angled) reflectors 57. Regions between the reflectors can be filled with a transparent material or be without any material. The reflectors 57 are each arranged above the first unit cells E1 and delimit them. For example, the reflectors 57 are arranged above the chip groups in such a way that they come to rest in a connection line between the luminescence diode chips of a chip group. It is advantageous if one length of the reflectors essentially corresponds to the edge length of the luminescence diode chips.

Figure 11A:
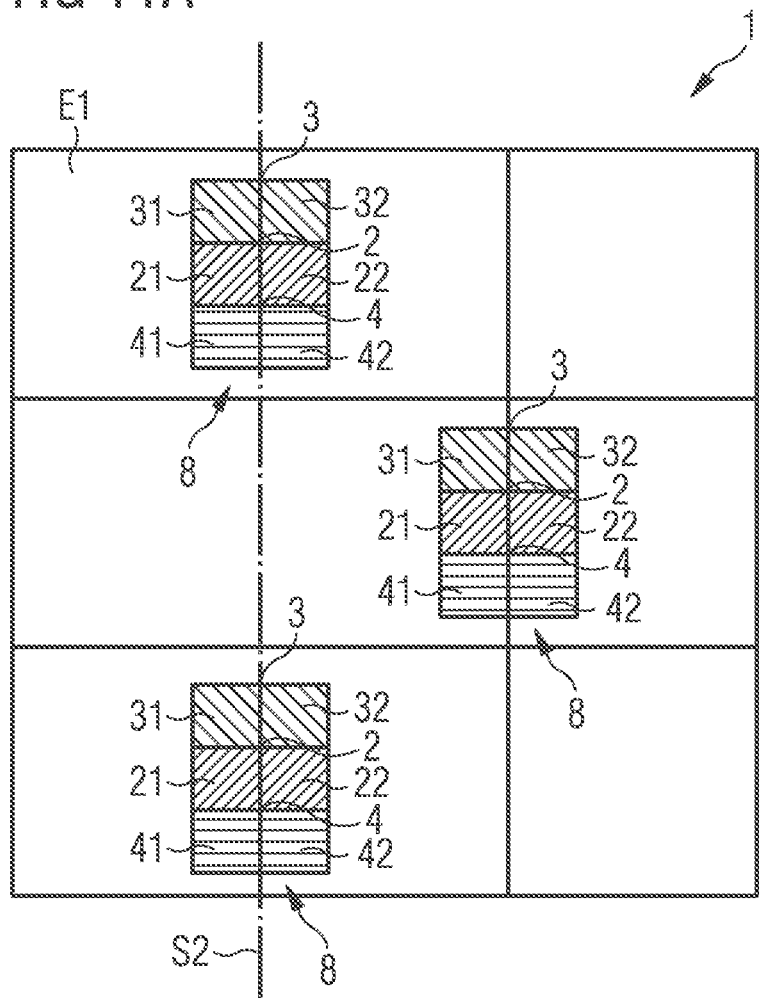
Figure 11B:
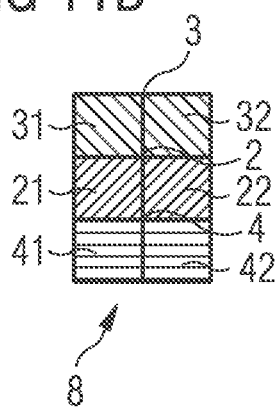

FIGS. 11A and 11B show top views of an exemplary embodiment of an optical assembly described herein.

In FIG. 11A, modules 8 are arranged on the edges of the first unit cells E1 on the carrier 1. The modules 8 each comprise several chip groups 2, 3, 4, which each have different wavelength characteristics. Thus, each module 8 forms, for example, a so-called RGB pixel with luminescence diode chips that emit red, green and blue light during operation.

FIG. 11B shows the structure of a single module 8. This module 8 consists of several chip groups 2, 3, 4, which in turn comprise several luminescence diode chips 21, 22, 31, 32, 41, 42.

Figure 12:
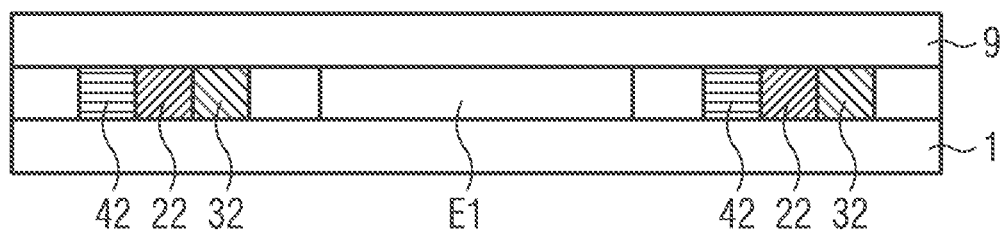

FIG. 12 shows a lateral sectional view of the optical assembly from FIG. 11A along the drawn cutting line S2. Modules 8 are mounted on an auxiliary carrier 9, for example, by gluing. Then the modules 8 together with the auxiliary carrier 9 are positioned on the carrier 1 and the auxiliary carrier 9 is detached.

Figure 13:
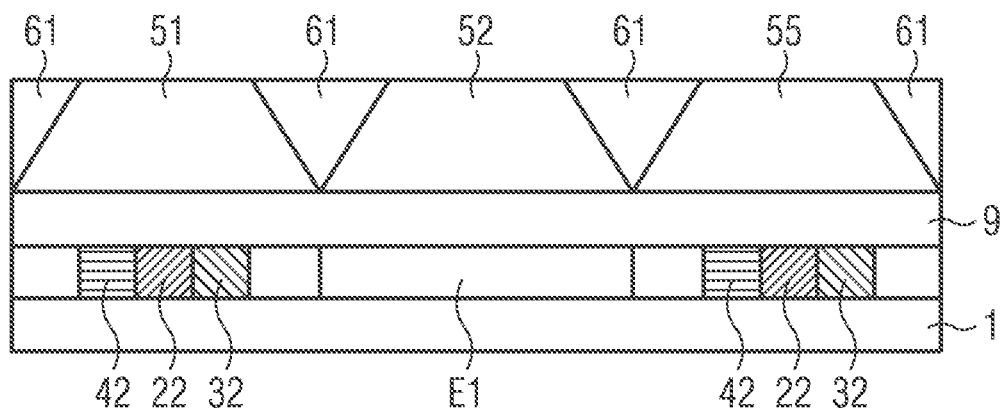

The optical assembly in the exemplary embodiment in FIG. 13 has the same structure as the optical assembly in the exemplary embodiment in FIG. 12. The auxiliary carrier 9 is not detached, but it is transparent for the electromagnetic radiation. On the upper side of the transparent auxiliary carrier 9 facing away from the luminescence diode chips, the optical subunits 51, 52 and 55 can be mounted, for example, by gluing or "direct bonding".

FIGS. 14A and 14B show top views of an exemplary embodiment of an optical assembly described herein.

In the exemplary embodiment in FIG. 14A, the modules 8 are arranged at the corners of the unit cells 1 on the carrier 1.

FIG. 14B shows a single module 8, which is composed of several chip groups 2, 3, 4, which in turn comprise several luminescence diode chips 21, 22, 31, 32, 41, 42.

The invention claimed is:
1. An optical assembly comprising:
a common carrier;
a plurality of first chip groups, each first chip group comprising at least two similar luminescence diode chips;
a plurality of second chip groups, each second chip group comprising at least two similar luminescence diode chips, wherein the first and second chip groups are arranged planar along a regular grid of first unit cells on a main surface of the common carrier; and
an optical element arranged downstream of the first and second chip groups with respect to a main radiation direction,
wherein the luminescence diode chips of the different chip groups are configured to emit electromagnetic radiation with different wavelength characteristics,
wherein the luminescence diode chips within a chip group are arranged side by side and are configured to emit in a same spectral region,
wherein at least one luminescence diode chip from one of the first chip groups and at least one luminescence diode chip from one of the second chip groups are assigned to each of the first unit cells, wherein subunits of the optical element are arranged in openings of a mask, wherein interspaces between the luminescence diode chips are filled with an opaque material, wherein a reflective or specular material is arranged on a surface of the interspaces, wherein the optical element is configured to combine light emitted by the luminescence diode chips of the chip groups into second unit cells in an extraction plane in such a way that at least one second unit cell has an area which is less than or equal to an area of one of the first unit cells, and wherein the opaque material and the reflective or specular material are in direct contact with the luminescence diode chips.

2. The optical assembly according to claim 1, wherein a first distance between luminescence diode chips within a chip group is smaller than a second distance between luminescence diode chips of adjacent chip groups.

3. The optical assembly according to claim 1, further comprising at least a plurality of further chip groups of luminescence diode chips, wherein the luminescence diode chips of the further chip groups are configured to emit electromagnetic radiation having a different wavelength characteristic from those of the first and second chip groups, wherein at least one luminescence diode chip from one of the first, second and further chip groups are assigned to each of the first unit cells, wherein the optical element is arranged to combine light emitted by the luminescence diode chips of the first, second and further chip groups in the second unit cells in such a way that at least one second unit cell comprises the area which is less than or equal to the area of one of the first unit cells.

4. The optical assembly according to claim 1, wherein each chip group comprises at least two luminescence diode chips.

5. The optical assembly according to claim 1, wherein the chip groups are each arranged either between corners of the first unit cells and the corners of the first unit cells are free of luminescence diode chips, or
the chip groups are arranged at the corners of the first unit cells.

6. The optical assembly according to claim 1, wherein the luminescence diode chips of one chip group directly adjoin one another.

7. The optical assembly according to claim 1, wherein the luminescence diode chips of one chip group are formed monolithically with one another.

8. The optical assembly according to claim 3, wherein the optical element is set up and arranged downstream of the chip groups in such a way that in each case emitted light from the luminescence diode chips, which are jointly assigned to one of the first unit cells, is combined by the optical element in a corresponding one of the second unit cells in the extraction plane.

9. The optical assembly according to claim 1, wherein each subunit is assigned to one of the first unit cells and arranged downstream of the chip groups such that the subunits cover at least a part of the associated first unit cells along the main radiation direction.

10. The optical assembly according to claim 1, wherein the mask is applied to the optical element by at least one selected from the group consisting of printing, gluing, laminating, casting and molding.

11. The optical assembly according to claim 1, wherein a reflective material or a light-scattering material is located at at least one of surfaces of the mask or surfaces of the optical element.

12. The optical assembly according to claim 1, wherein each subunit comprises an optical light guide arranged to combine the light emitted by the luminescence diode chips of the chip groups by total reflection on internal surfaces of the subunits in the second unit cells.

13. The optical assembly according to claim 1, wherein each subunit comprises at least one mirrored surface, and is arranged to combine the light emitted by the luminescence diode chips of the chip groups by reflection in the second unit cells.

14. The optical assembly according to claim 3, further comprising a transparent auxiliary carrier arranged between the optical element and the chip groups.

15. A method for manufacturing an optical assembly according to claim 1, the method comprising:
mounting the at least two chip groups on an auxiliary carrier for generating a module; and
arranging and fastening the module on the common carrier, wherein the chip groups are facing the common carrier.

16. The method according to claim 15, further comprising detaching the auxiliary carrier from the chip groups.

17. A display device comprising:
the optical assembly according to claim 3; and
a control unit configured to drive the luminescence diode chips in the chip groups,
wherein the common carrier comprises a printed circuit board, a substrate or a ceramic.

18. The optical assembly according to claim 1, wherein an absorbing material is applied to surfaces of the optical element.

* * * * *

UNITED STATES PATENT AND TRADEMARK OFFICE
CERTIFICATE OF CORRECTION

PATENT NO. : 11,152,423 B2  
APPLICATION NO. : 16/098283  
DATED : October 19, 2021  
INVENTOR(S) : Peter Brick et al.

Page 1 of 1

It is certified that error appears in the above-identified patent and that said Letters Patent is hereby corrected as shown below:

In the Claims

Claim 8, Column 11, Line 49; delete "according to claim 3" and insert --according to claim 1--.

Claim 14, Column 12, Line 29; delete "according to claim 3" and insert --according to claim 1--.

Claim 17, Column 12, Line 42; delete "according to claim 3" and insert --according to claim 1--.

Signed and Sealed this  
Fourteenth Day of December, 2021

Drew Hirshfeld  
*Performing the Functions and Duties of the*  
*Under Secretary of Commerce for Intellectual Property and*  
*Director of the United States Patent and Trademark Office*